United States Patent [19]

Wiggers

[11] Patent Number: 4,998,262
[45] Date of Patent: Mar. 5, 1991

[54] GENERATION OF TOPOLOGY INDEPENDENT REFERENCE SIGNALS

[75] Inventor: Hans A. M. Wiggers, Saratoga, Calif.

[73] Assignee: Hewlett-Packard Company, Palo Alto, Calif.

[21] Appl. No.: 419,345

[22] Filed: Oct. 10, 1989

[51] Int. Cl.$^5$ .............................................. H04L 7/00
[52] U.S. Cl. ...................................... 375/107; 328/55; 370/108
[58] Field of Search ................. 375/36, 38, 106, 107, 375/118, 10; 455/27, 49, 51; 328/55, 58, 72; 370/108; 371/1; 307/262, 511

[56] References Cited

U.S. PATENT DOCUMENTS

| | | | |
|---|---|---|---|
| 3,876,983 | 4/1975 | Zafiropulo et al. | 375/107 |
| 4,481,647 | 11/1984 | Gombert et al. | 375/107 |
| 4,541,100 | 9/1985 | Sutton et al. | 375/10 |
| 4,604,582 | 8/1986 | Strenkowski et al. | 328/55 |
| 4,761,799 | 8/1988 | Arragon | 375/107 |
| 4,795,985 | 1/1989 | Gailbreath | 328/55 |
| 4,837,850 | 6/1989 | Maiset et al. | 375/107 |
| 4,862,158 | 8/1989 | Keller et al. | 375/107 |

Primary Examiner—Douglas W. Olms
Assistant Examiner—Stephen Chin

[57] ABSTRACT

A method and structure for providing plurality signals which are substantially synchronous at a plurality of distant points within a system is approached from a different point of view. Rather than employing a plurality of delays for adding various delay times to certain leads carrying the signal in question, in accordance with the teachings of this invention two separate leads are used to route such a signal within a system. The receiving circuitry are connected to the two leads carrying the signal in opposite order, that is the first receiver connected to the first lead is the last receiver connected to the second lead, the second receiver connected to the first lead is the next to last receiver connected to the second lead, and so on. In this manner, the average of the propagation delays between the first and second leads at any given receiver is substantially equal. A locally derived signal is generated for each of the receivers based upon the two signals provided by the source. Each of the locally generated signals are substantially synchronized. In one embodiment, a novel circuit is employed to generate a local signal for application to a particular receiver which includes a phase lock loop employing two phase detectors, one for comparing the phase of each of the two signals provided by source at the location of the receiver in question.

6 Claims, 2 Drawing Sheets

GENERATION OF TOPOLOGY INDEPENDENT REFERENCE SIGNALS

BACKGROUND

This invention pertains to electronic circuits and more particularly to a method and structure for deriving a plurality of signals which are substantially synchronous regardless of where within a large system each signal is derived.

FIG. 1 is a diagram depicting a typical prior art high speed computer system or high frequency measurement system, or the like. In system 100, a signal such as a clock signal is applied to input terminal 99 of driver 101. Driver 101 provides a plurality of signals on leads 104-1 through 104-8, which are typically formed as printed circuit board traces or wiring buses. Naturally, in most systems, the shortest distance between driver 101 and receiver circuits 102-1 through 102-8 which must receive the timing signal have differing propagation delays due to different physical lengths, capacitances, and the like. In the prior art example of FIG. 1, the physical lengths of certain ones of leads 104-1 through 104-8 are adjusted to be longer than the minimum required for electrical connection, in order to insure that all leads 104-1 through 104-8 have substantially equal propagation delays. By providing substantially equal propagation delays, timing edges occur substantially simultaneously at receivers 102-1 through 102-8. In other words, the signal provided by driver 101 arrives at each of receivers 102-1 through 102-8 at the same time such that the arrived signals are substantially synchronous.

Unfortunately, adjusting propagation delays by adjusting the physical lengths of leads 104-1 through 104-8 is expensive, consumes additional space on a printed circuit board, and is somewhat of a hit and miss proposition. Furthermore, the great care and expense required to adjust propagation delays in this manner must be repeated every time the system configuration is changed.

Another prior art technique for attempting to provide a signal having edges occurring substantially simultaneously at a plurality of receiving circuits within a large system is to include propagation delay means other than an additional length of system leads, such as leads 104-1 through 104-8 of the system of FIG. 1. Such propagation delay means are well known in the art and include, for example, the phase lock loop delay means as described in U.S. Pat. No. 4,795,985 on an invention of Gailbreath and assigned to Hewlett Packard Company of Palo Alto, Calif., the assignee of this invention.

SUMMARY OF THE INVENTION

In accordance with the teachings of this invention, a method and structure for providing plurality signals which are substantially synchronous at a plurality of distant points within a system is approached from a different point of view. Rather than employing a plurality of delay means for adding various delay times to certain leads carrying the signal in question, in accordance with the teachings of this invention two separate leads are used to route such a signal within a system. The receiving circuitry are connected to the two leads carrying the signal in opposite order, that is the first receiver connected to the first lead is the last receiver connected to the second lead, the second receiver connected to the first lead is the next to last receiver connected to the second lead, and so on. In this manner, the average of the propagation delays between the first and second leads at any given receiver is substantially equal. A locally derived signal is generated for each of the receivers based upon the two signals provided by the source. Each of the locally generated signals are substantially synchronized.

In one embodiment of this invention, a novel circuit is employed to generate a local signal for application to a particular receiver which includes a phase lock loop employing two phase detectors, one for comparing the phase of each of the two signals provided by source at the location of the receiver in question.

DETAILED DESCRIPTION

Figure 1:
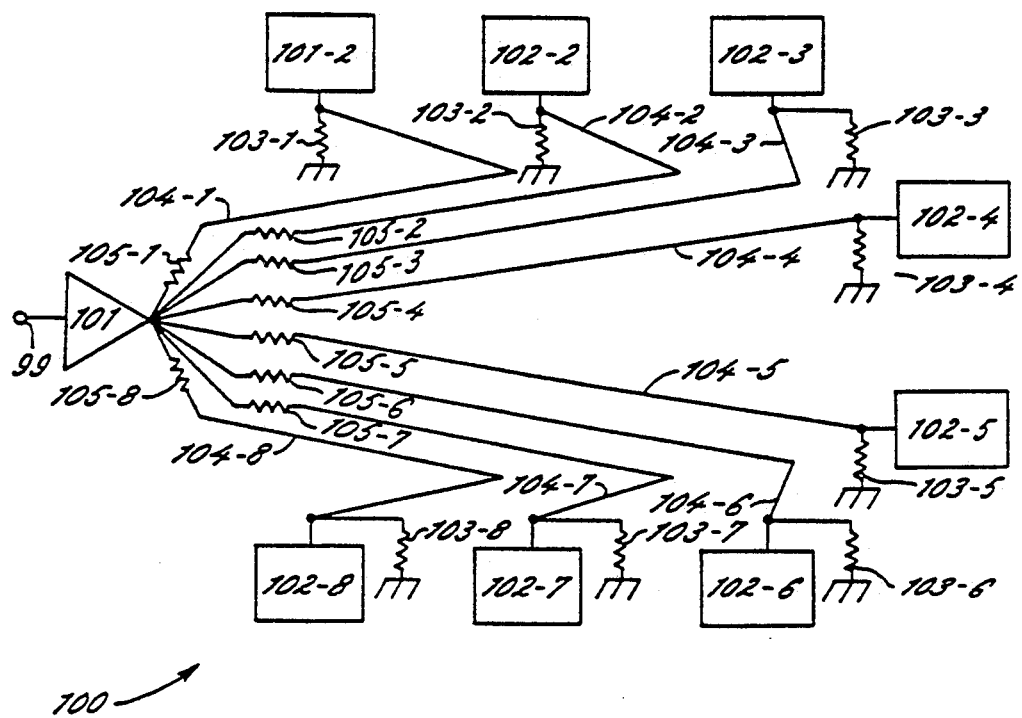
FIG. 1 is a diagram depicting a typical prior art system including additional delays provided by adjusting the length of system leads.
Figure 2:
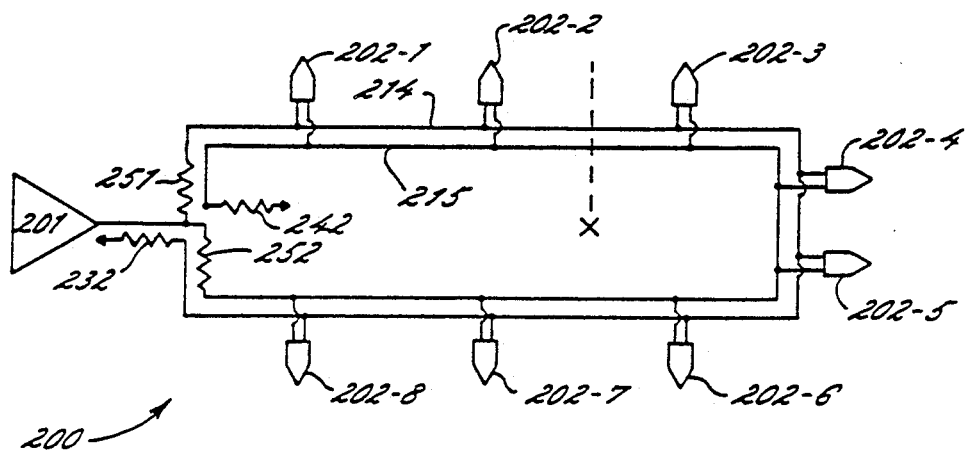
FIG. 2 is a diagram depicting one embodiment of a system constructed in accordance with the teachings of this invention.

FIG. 2 is a diagram depicting one embodiment of a system constructed in accordance with the teachings of this invention. System 200 of FIG. 2 includes signal source 201 for providing a signal, such as a clock or timing signal, which is to be distributed to a plurality of receivers 202-1 through 202-8 such that locally generated timing signals are substantially synchronous at each of the receivers. In accordance with the teachings of this invention, two signal paths 214 and 215 are used. Signal path 214 is referred to as the forward path which propagates the signal output from source 201 through termination 251 (typically a resistor) through forward path 214 and to ground through termination 232. In a similar fashion, backward path 215 propagates the signal source 201 through termination 252, backward path 215, and to ground through termination 242.

As the signal provided by source 201 travels down forward path 214 to an arbitrary location X, the forward signal is delayed by an amount $$t_f = \frac{x}{c\sqrt{\epsilon_r}} ; \text{ where} \quad (1)$$

$t_f$ = the propagation delay of the forward signal on forward path 214 at location $X$;

$x$ = the physical distance along forward path 214 between the output of source 201 and location $X$;

$c$ = the speed of light; and $\epsilon_r$ = the permeability of the material associated with paths 214 and 215 (i.e. printed circuit board material)

Similarly, same signal output from source 201 travelling down backward path 215 at location X is delayed by an amount $$t_b = \frac{(1-x)}{c \, \epsilon_r} \; ; \text{ where} \qquad (2)$$

$t_b$ = the propagation delay of the backward signal on backward path 215 at location $X$; and $l$ = the physical length of forward path to 214, which is equal to the physical length of backward path 215.

In equations 1 and 2, it is assumed that effective length of forward path 214 and backward path 215 is adjusted from the physical length only by the permeability of the material associated with paths 214 and 215. As is readily understood by those of ordinary skill in the art in light of the teachings of this invention, appropriate correction factors can, if necessary, be added to equations 1 and 2 to compensate for influence to the propagation delays along forward path 214 and backward path 215 due to other factors, such as capacitance, inductance, and the like.

Of importance, the average propagation delay ($t_{avg}$) at location X is equal to $$t_{avg} = t_f + \frac{(t_f - t_b)}{2} \qquad (3)$$

Inserting the values of $t_f$ and $t_b$ from equations 1 and 2, respectively, into equation 3 gives $$t_{avg} = \frac{1}{2 \, c \, \epsilon_r} \qquad (4)$$

Thus, the average propagation delay $t_{avg}$ is constant anywhere along the topology defined by forward path 214 and backward path 215, and is equal to the propagation delay of the forward signal at a point equal to one-half of the length of forward path 214, and also equal to the propagation delay of the backward signal at that same point, i.e., at a point equal to one-half of the length of backward path 215.

Figure 3:
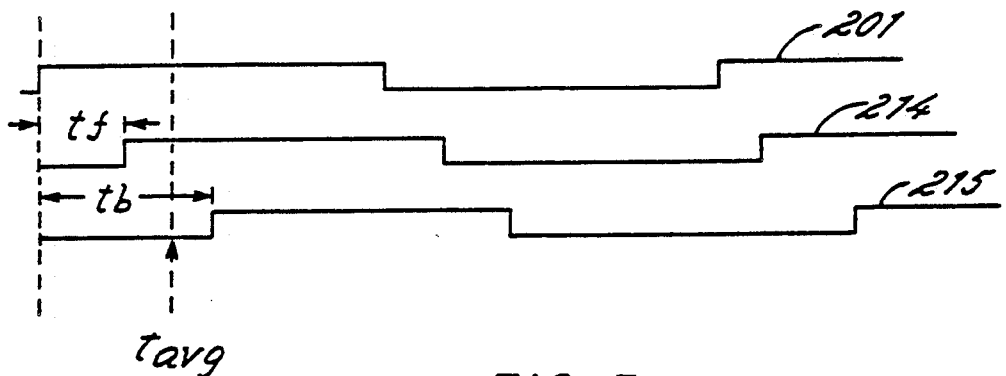
FIG. 3 is a set of timing diagrams describing the operation of the embodiment of FIG. 2.

FIG. 3 depicts the timing relationship between the signal provided by source 201, the forward signal at a given point along forward path 214, and the backward signal at a corresponding location along backward path 215. Of importance, as the location along paths 214 and 215 changes, the forward propagation delay $t_f$ and the backward propagation delay $t_b$ shown in FIG. 3 vary inversely, i.e. as $t_f$ increases, $t_b$ decreases and visa versa. However, of primary importance, the value of $t_{avg}$ will remain constant anywhere along the topology shown in FIG. 2, and is midway between the signal on forward lead 214 at location X which is delayed forward propagation delay $t_f$ and the signal on backward path 215 at location X which is delayed by a propagation delay $t_b$.

While FIG. 3 depicts the relationship between signals within system 200 of FIG. 2 when source 201 provides a square wave output signal, the timing relationships apply equally when source 201 provides output signals which are other than square waves, for example, sine waves, triangle waves, saw tooth, or even very complex analog or digital data signals, for example.

Figure 4:
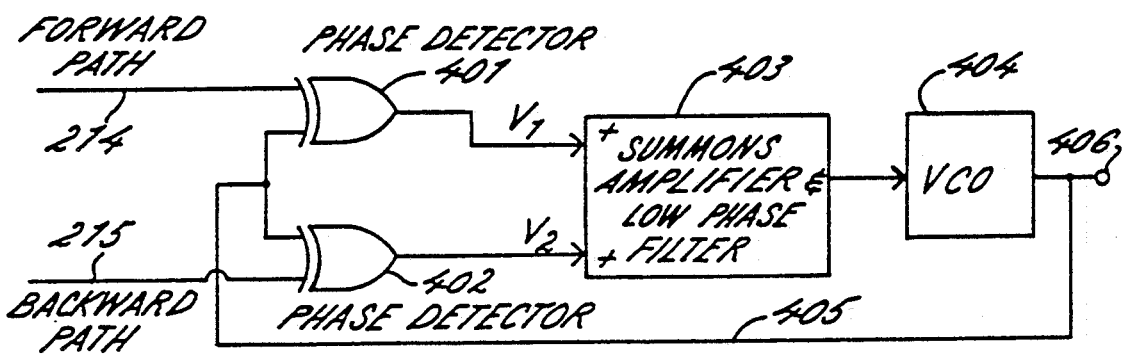
FIG. 4 is a block diagram depicting one embodiment of a circuit suitable for generating a locally derived signal at a desired location in the system of FIG. 2.

FIG. 4 is a schematic diagram of one embodiment of a circuit constructed in accordance with the teachings of this invention suitable for providing on its output terminal 406 a signal corresponding to the output signal of source 201 (FIG. 2) at a fixed propagation delay $t_{avg}$, regardless of the location at which the forward signal and backward signal are sampled from forward path 214 and backward path 215 of FIG. 2. Since the embodiment of FIG. 4 employs a phase lock loop, the signal provided by source 201 of FIG. 2 must be one that is capable of being phase locked in order to utilize the circuit of FIG. 4. However, the teachings of this invention apply equally well to signals which are not capable of being phase locked, in which event a circuit other than that depicted in FIG. 4 must be utilized in order to provide the locally generated signal corresponding to the signal provided by source 201 and having a fixed delay $t_{avg}$.

Referring again to FIG. 4, circuit 400 may be thought of as a phase lock loop including two phase detectors 401 and 402. In the embodiment shown in FIG. 400, phase detectors 401 and 402 are shown as exclusive OR gates. One input lead of phase detector 401 is connected to forward path signal 214 (FIG. 2), and a corresponding input lead of phase detector 402 is connected to backward signal path 215. The other input lead of phase detectors 401 and 402 are connected in common through feedback lead 405 to the output lead of voltage controlled oscillator (VCO) 404. The output leads of phase detectors 401 and 402 are connected to the input leads of summing amplifier and low pass filter 403, whose output signal is applied to the control input terminal of VCO 404.

The operation of circuit 400 is described as follows. Phase detector 401 serves to compare the phase of the output signal of VCO 404 with the phase of the forward signal on forward path 214 at a specified location. Similarly, phase detector 402 serves to compare the phase of the output signal of VCO 404 with the phase of the backward signal on backward lead 215 at a corresponding location. The output signals from phase detectors 401 and 402 are summed and filtered by summing amplifier and low pass filter 403 to provide a low frequency control voltage which controls the output frequency of VCO 404. This arrangement serves to cause VCO 404 to provide an output signal which is locked 90° out of phase with the virtual signal $t_{avg}$ (FIG. 3).

Of importance, the output signal from VCO 404 is phase locked to provide an output signal having a fixed propagation delay $t_{avg}$ from the output signal of source 201, regardless where within the topology circuit 400 is connected. Thus, referring again to FIG. 2, each of the plurality of receivers 202-1 through 202-8 include a corresponding circuit 400 (FIG. 4) which provides a signal corresponding to the signal provided by source 201 which are substantially synchronous, i.e. have equal propagation delays $T_{avg}$.

In an alternative embodiment of this invention, phase detectors 401 and 402 are provided as more sophisticated phase detectors, for example, phase detectors which detect both the frequency and phase of the incoming signals with reference to the output signal from VCO 404. One such prior art phase detector is included as a portion of the Motorola MC14568B device.

Figure 5:
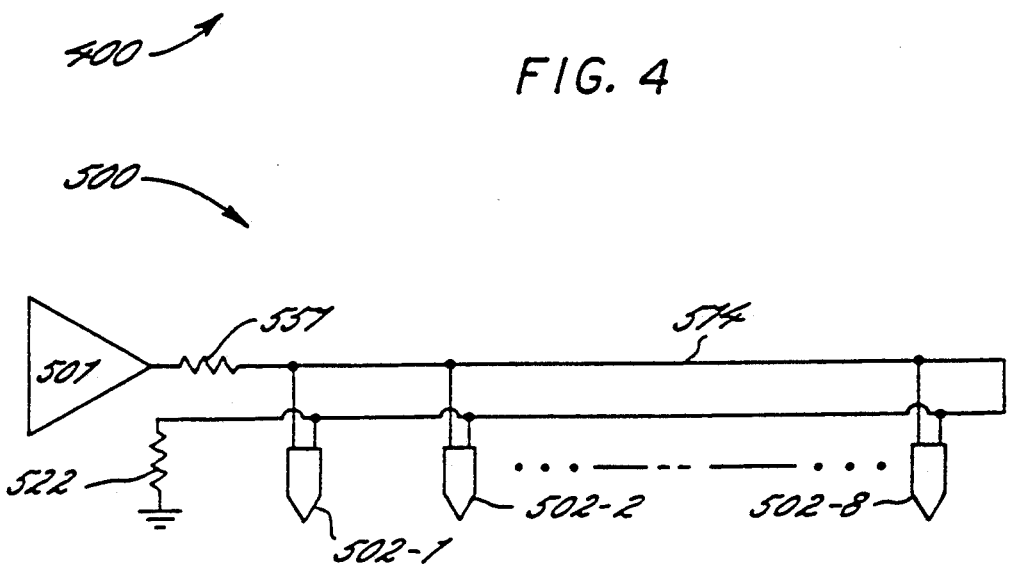
FIG. 5 is a diagram depicting another embodiment of this system constructed in accordance with the teachings of this invention.

FIG. 5 is a diagram depicting another embodiment of the system constructed in accordance with the teachings of this invention. System 500 of FIG. 5 includes signal source 501 which provides a signal which is to be distributed to a plurality of receivers 502-1 through 502-8. In accordance with the teachings of this invention, a single signal path 514 is used, and each receiver 502-1 through 502-8 receives input signals from two locations on signal path 514. In this manner, assuming that X is the distance between signal source 501 and a first lead of a given one of receivers 502-1 through 502-8, and 1 is the physical length of path 514 from source 501 to termination 552, equations (1) and (2) hold true for the embodiment of FIG. 5. Accordingly, the derived equations (3) and (4) also hold true for the embodiment of FIG. 5. In this manner, a single signal path 514 is used in order to feed a plurality of receivers 502-1 through 502-8 which are then able to provide a locally derived signal as a function of the signal provided by signal source 501, which are substantially synchronous.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. An electronic system comprising:
    a signal source for providing an initial signal;
    a plurality of receivers requiring the use of an associated one of a plurality of locally generated signals, each of said plurality of locally generated signals corresponding to said initial signal and delayed from said initial signal by a predefined time;
    a forward path having an end for receiving said initial signal, each of said plurality of receivers being located at an associated one of a plurality of locations along said forward path such that each of said receivers has an associated forward propagation delay between said source and said location, such that said forward propagation delays are not equal;
    a backward path having an end for receiving said initial signal, each of said plurality of receivers being located at an associated one of a plurality of locations along said backward path such that each of said receivers has an associated backward propagation delay between said source and said location, such that backward propagation delays are not equal; and
    a plurality of means, each associated with one of said receivers, for combining the initial signal as received by that receiver through the forward path with the signal as received by that receiver through the backward path in order to generate a locally generated signal corresponding to said initial signal and having a propagation delay from said initial signal which is equal to the average of said forward propagation delay and said backward propagation delay associated with said receiver.

2. A system as in claim 1 wherein the sum of the distances along the forward and backward paths between said source and each of said receivers is substantially equal.

3. A system as in claim 2 wherein the total number of receivers is N, the locations along the forward path are designated from 1 to N beginning with the location closest to the end that receives the initial signal, the locations along the backward path are designated from 1 to N beginning with the location closest to the end that receives the initial signal, M is an integer not less than 1 nor greater than N, and a receiver which is located at the Mth position on the forward path is located at the (N+1-M)th position on the backward path.

4. Apparatus for providing a signal comprising:
    a first input lead for receiving a first signal corresponding to an initial signal and delayed from said initial signal by a first propagation delay;
    a second input lead for receiving a second input signal corresponding to said initial signal and delayed from initial signal by a second propagation delay;
    an output lead for providing a locally generated signal corresponding to said initial signal and delayed from said initial signal by a third propagation delay which is a function of said first and second propagation delays;
    a first phase detector for providing a first phase comparison signal indicative of the phase relationship between said first input signal and said locally generated signal;
    a second phase detector for providing a second phase comparison signal indicative of the phase relationship between said second input signal and said locally generated signal;
    means for combining said first and second phase comparison signals to provide a combined phase comparison signal; and
    a voltage controlled oscillator for providing said locally generated signal in response to said combined comparison signal.

5. An electronic system comprising:
    a signal source for providing an initial signal;
    a plurality of receivers, each having a first and second input lead, each of said receivers requiring the use of an associated one of a plurality of locally generated signals, each of said plurality of locally generated signals corresponding to said initial signal and delayed from said initial signal by a predefined time;
    a signal path having an end for receiving said initial signal, each of said first input leads of said plurality of receivers being connected to said signal path at an associated one of a first plurality of locations along said signal path such that each of said receivers has an associated first propagation delay between said source and said location, such that said first propagation delays are not equal, and each of said second input leads of said plurality of receivers being connected to said signal path at an associated one of a second plurality of locations along said signal path such that each of said receivers has an associated second propagation delay between said source and said location, such that said second propagation delays are not equal; and
    a plurality of means, each association with one of said receivers for combining said signals on said first and second input leads in order to generate a locally generated signal corresponding to said initial signal and having a propagation delay from said initial signal which is equal to the average of said first propagation delay and said second propagation delay associated with said receiver.

6. A system as in claim 5 wherein, for each receiver, the sum of the distances between said source and said first and second locations associated with said receivers is substantially equal to such sum associated with each other receiver.

* * * * *